United States Patent [19]

Redmond

[11] Patent Number: 4,464,661
[45] Date of Patent: Aug. 7, 1984

[54] SYSTEM MONITOR CIRCUIT HAVING FIRST AND SECOND PHASE-SENSITIVE DEMODULATOR CIRCUITS COUPLED TO FIRST AND SECOND LOADS, AND A COMPARATOR SECTION FOR MONITORING THE LOADS

[75] Inventor: William G. Redmond, Dallas, Tex.

[73] Assignee: The LTV Aerospace and Defense Company, Dallas, Tex.

[21] Appl. No.: 349,791

[22] Filed: Feb. 18, 1982

[51] Int. Cl.³ .............................................. G08B 21/00
[52] U.S. Cl. ................................... 340/960; 307/355; 318/565; 328/147; 329/146; 340/945; 340/963
[58] Field of Search ............ 244/50, 100 R; 307/355, 307/356; 318/563, 565; 324/118; 328/146, 147; 329/112, 146; 340/27 R, 635, 653, 661, 664; 356/248

[56] References Cited

U.S. PATENT DOCUMENTS 2,953,323 9/1960 Minch ................................... 244/50
4,221,350 9/1980 Moser et al. ......................... 244/50

FOREIGN PATENT DOCUMENTS 2150888 4/1973 Fed. Rep. of Germany ...... 329/192

Primary Examiner—Siegfried H. Grimm
Assistant Examiner—Robert Pascal
Attorney, Agent, or Firm—S. S. Sadacca; James M. Cate

[57] ABSTRACT

A pair of simple phase-sensitive full-wave high-gain demodulator circuits generate an output for both halves of an AC reference cycle. One of the demodulator circuits is utilized as an amplifier to drive, for example, the steering system servo valve in an aircraft steering system and the other demodulator drives a dummy load which has a resistivity approximately equal to the resistivity of the servo valve coils. The output current from both demodulators are compared, for example, by an opto isolator or coupler which generates corrective and/or warning signals in case a system failure occurs. In one embodiment, the sensor output loop is maintained at a predetermined voltage level above ground so that an open circuit in the sensor loop is detected by additional sensing circuits.

18 Claims, 3 Drawing Figures

SYSTEM MONITOR CIRCUIT HAVING FIRST AND SECOND PHASE-SENSITIVE DEMODULATOR CIRCUITS COUPLED TO FIRST AND SECOND LOADS, AND A COMPARATOR SECTION FOR MONITORING THE LOADS

This invention relates to monitoring circuits and more particularly to a sensor monitoring system embodying a pair of phase-sensitive full wave demodulator circuits.

The Government has rights in this invention pursuant to Contract No. F34601-80-C-1290 awarded by the United States Air Force.

BACKGROUND OF THE INVENTION

The nose gear, e.g., wheel steering system of an aircraft, is generally a single channel hydroelectric mechanism and has the potential to create a hazardous situation if certain failures occur during critical phase of aircraft operation. The electrohydraulic servo of the steering system includes a pedal position linear variable differential transducer (LVDT) which provides nose gear position command, a servo loop comprised of an electrohydraulic valve driven by a valve driver amplifier and a linear actuation position feedback transducer. Potential for failures exists in the servo loop. A wiring failure between the valve drive amplifier and the valve will result in a relatively slow drift of nose gear rotation because the current in both valve coils becomes zero, and control of the valve is lost. Certain failures in the valve drive amplifier such as a shorted or open transistor will result in a rapid nose gear rotation due to errant current in the valve coils. An open wire in the excitation wiring of the position feedback transducer will cause the nose gear to be difficult to control, since pilot inputs would control nose gear rate and not position. An open wire in the feedback transducer output will also cause a system failure and the input transducer will have no control. Failures occurring outside the servo loop are typically less hazardous. It is therefore desirable to provide a monitoring system to detect failures and automatically disengage the nose gear steering system.

It is therefore an object of the present invention to provide an improved monitoring circuit.

Another object of the invention is to provide a monitoring circuit utilizing a pair of simplified phase-sensitive full wave amplifying demodulators.

Still another object of the invention is to provide a system for monitoring the integrity of an aircraft nose gear steering system.

BRIEF DESCRIPTION OF THE INVENTION

These and other objects are accomplished in accordance with the circuit of the present invention in which a pair of simple phase-sensitive full-wave high-gain demodulator circuits generate an output for both halves of an AC reference cycle. One of the demodulator circuits is utilized as an amplifier to drive, for example, the steering system servo valve in an aircraft steering system, and the other demodulator drives a dummy load which has a resistivity approximately equal to the resistivity of the servo valve coils. The output current from both demodulators are compared, for example, by an opto isolator or coupler which generates corrective and/or warning signals in case a system failure occurs. In one embodiment, the sensor output loop is maintained at a predetermined voltage level above ground so that an open circuit in the sensor loop is detected by additional sensing circuits.

BRIEF DESCRIPTION OF THE DRAWINGS

A preferred embodiment of the invention utilizes a pair of my earlier developed phase-sensitive full-wave demodulator circuits which are the subject of co-pending patent application Ser. No. 349,792 filed Aug. 11, 1981 of even date with and assigned to the assignee of the present application.

Still further objects and advantages of the invention will become apparent from the detailed description and claims when read in conjunction with the drawings in which:

DETAILED DESCRIPTION OF A PREFERRED EMBODIMENT

Figure 1:
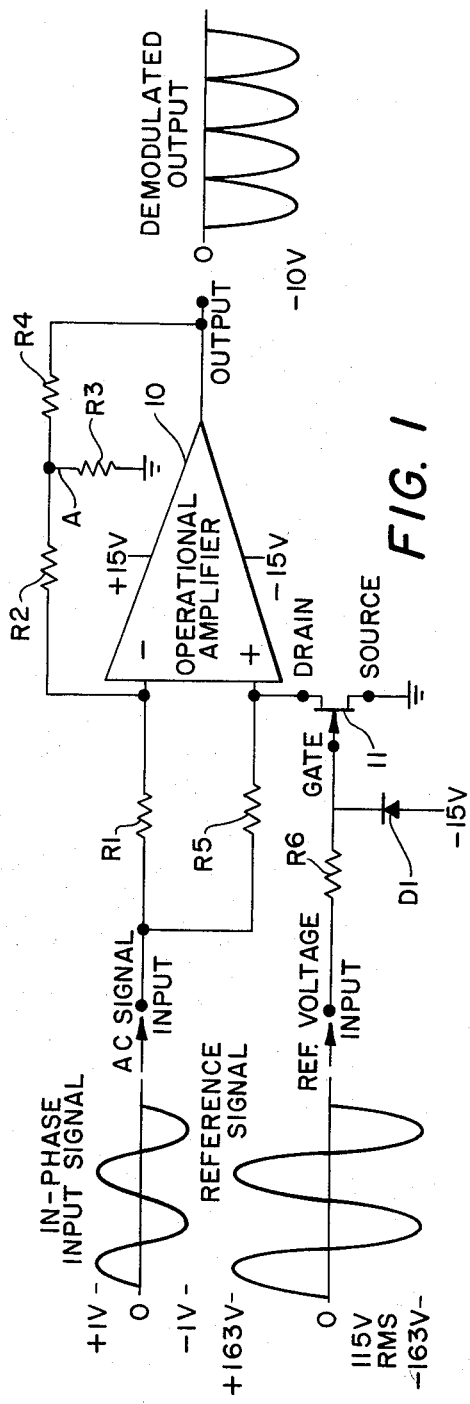
FIGS. 1 and 2 are schematic diagrams illustrating a phase-sensitive full-wave demodulator circuit employed in an embodiment of the present invention with in-phase and opposite-phase input signals applied thereto, respectively.

Referring now to the drawings, and in particular to the demodulator circuit of FIG. 1, an in-phase input signal with a peak value of, for example, 1 volt is applied to the AC signal input through resistive means R1 and resistive means R5 to the negative "−" and positive "+" and input terminals respectively of operational amplifier 10. A 115 volt (rms) AC reference voltage is applied to the reference voltage input through resistive means R6 to the gate of field effect transistor (FET) 11. In the embodiment of FIG. 1, R1, R2, R5, and R6 are, for example, 200 kilohms, R3 is 1 kilohm and R4 is 9 kilohms. In any case, R1 and R2 are of equal values to provide the same output amplitude for in-phase and opposite-phase AC input signals.

During the positive half cycle of the AC reference voltage, FET 11 is turned ON to conduct, by virtue of its gate being driven slightly positive. This effectively grounds the positive input terminal of operational amplifier 10, making the circuit an inverting amplifier. Thus, when the input signal is at +1 volt, the voltage at node A must be at −1 volt to make the voltage at the negative input terminal of operational amplifier 10 equal to the same voltage as the positive input terminal of operational amplifier 10, which is 0. Due to the voltage divider comprised of resistive means R3 and R4, the voltage at node A will be 1/(1+9) or 1/10th of the output voltage; therefore, the output peak voltage is 10×(−1 volt) or −10 volts during the positive half cycle of the AC reference voltage.

During the negative half cycle of the AC reference voltage, FET 11 is turned OFF, (an open circuit from drain to source) by virtue of its gate being driven a few volts negative, e.g., 0.8 volts min to 4 volts max for a 2N4858 FET. Diode D1 tied from the gate of FET 11 to −15 volts prevents the gate from going more negative than approximately −15.6 volts. The gate-to-source voltage for a 2N4858 should be limited to −40 volts to prevent damage. FET 11 being OFF makes the circuit a voltage follower.

Thus, when the in-phase input signal is at −1 volt, node A must also be at −1 volt to make the negative input to operational amplifier 10 the same voltage as the positive input terminal of operational amplifier 10, which is −1 volt. The output peak voltage is 10×(−1 volt) or −10 volts during the negative half cycle of the reference AC voltage.

Thus, for an in-phase input signal, the circuit provides the same negative output for both half cycles of the AC input signal; this constitutes demodulation. The output amplitude which is 10 times the input amplitude, provides a gain of 10. This gain may be adjusted as desired by changing the value of resistive means R4; e.g., a value of 99 kilohms provides a gain of 100.

Figure 2:
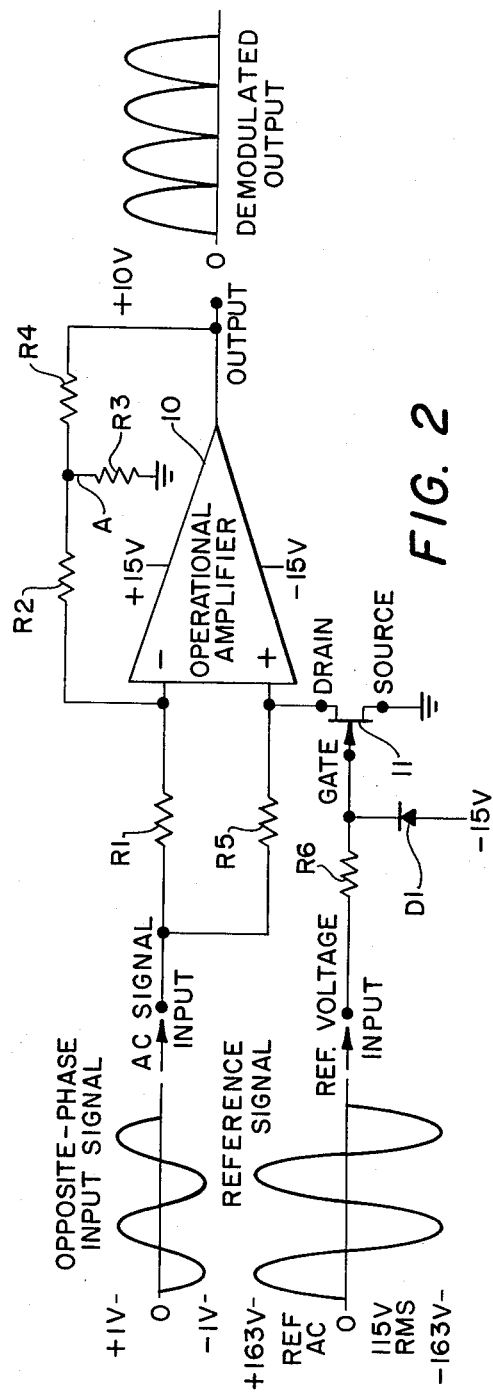

FIG. 2 is a schematic diagram of the same circuit illustrated in FIG. 1 with a 1 volt peak input signal which is 180° out of phase (opposite phase) with respect to the AC reference voltage. During the positive half cycle of the AC reference voltage, FET 11 is turned ON to provide a conductive path from drain to source by virtue of its gate being driven slightly positive. This effectively grounds the positive input terminal of operational amplifier 10, making the circuit an inverting amplifier. Thus, when the input signal is at −1 volt, node A must be at +1 volt to make the negative input to operational amplifier 10 the same voltage as that at the positive input of operational amplifier 10, which is 0. Due to the voltage divider comprised of resistive means R3 and R4, the voltage at node A is 1/(1+9) or 1/10th of the output voltage; therefore, the output peak voltage will be 10×(+1 volt) or +10 volts during the positive half cycle of the reference voltage.

During the negative half cycle of the reference signal, FET 11 is turned OFF (open-circuit from drain to source) by virtue of its gate being driven by a few volts negative; e.g., 0.8 volts min to 4 volts max for a 2N4858 FET. FET 11 being OFF makes the circuit a voltage follower. Thus, when the input signal is at +1 volt, node A must also be at +1 volt to make the negative input terminal of operational amplifier 10 the same voltage as that at the positive input terminal of operational amplifier 10, which is +1 volt. The output peak voltage will be 10×(+1 volt) or +10 volts during the negative half cycle of the reference signal.

Thus, for an opposite-phase input signal, the circuit provides the same positive output for both half cycles of the AC input signal, which constitutes demodulation. The output amplitude which is 10 times the input amplitude provides a gain of 10. Again, this gain may be adjusted as desired by changing the value of resistive means R4; e.g., a value of 99 kilohms provides a gain of 100. The fact that the output is negative for an in-phase input signal and positive for an opposite-phase input signal indicates that the demodulator is phase sensitive. The demodulator has relatively high input impedance and low output impedance and does not greatly load the sensor or transducer devices which provide the input signal and provide a sufficient output signal to drive relatively low impedance loads such as the valve coils utilized in an aircraft nose gear steering (NGS) system.

Figure 3:
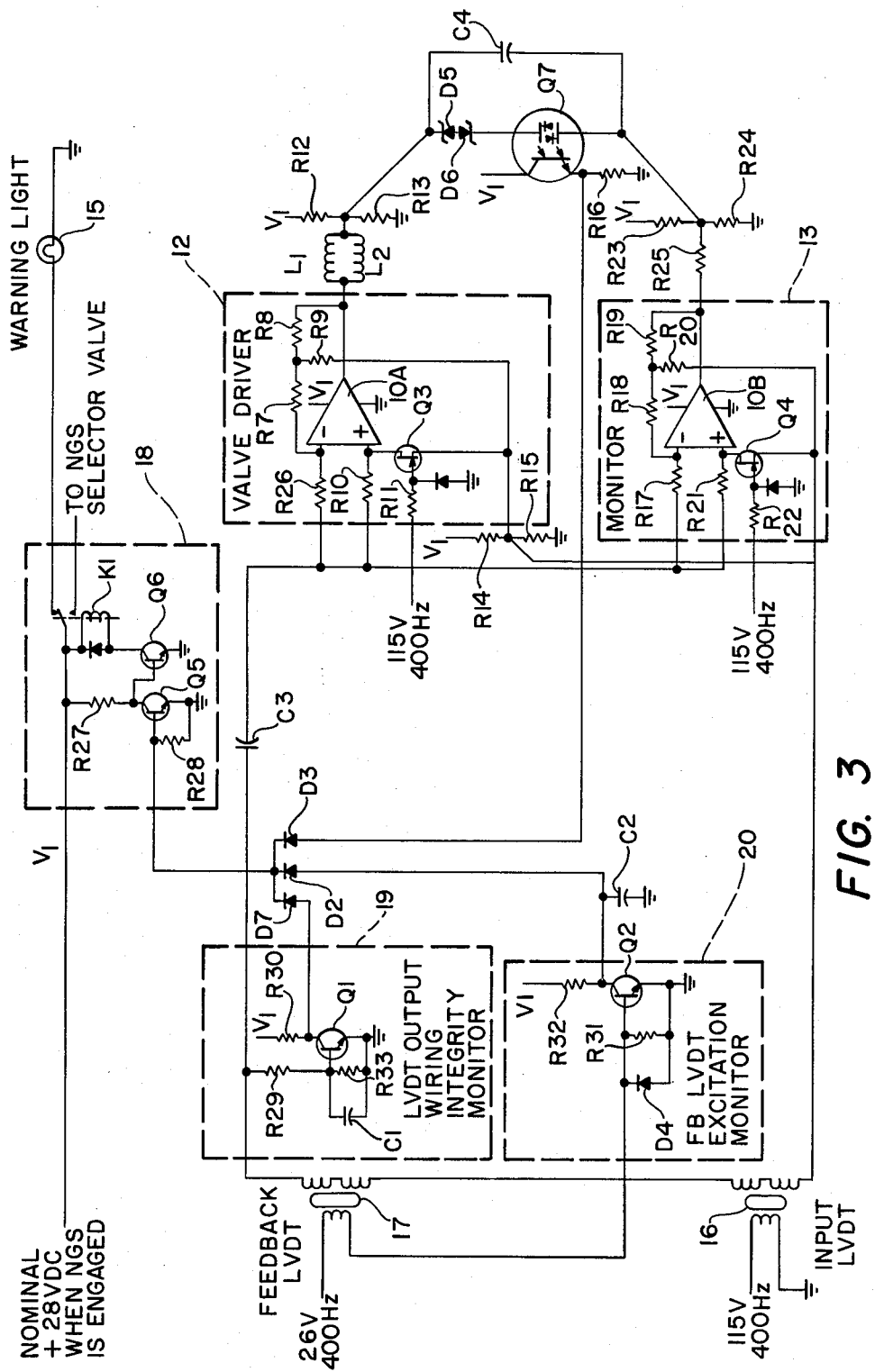
FIG. 3 is a schematic diagram of a monitored nose gear steering system of an aircraft embodying a pair of the phase-sensitive full-wave demodulator circuits of FIG. 1 according to the present invention.

Referring now to FIG. 3, a schematic diagram of a circuit for controlling and monitoring a nose gear steering (NGS) system is illustrated. The nose gear, e.g., wheel steering system, is generally a single channel electrohydraulic mechanism and has the potential to create a hazardous situation if certain failures occur during critical phases of aircraft operation.

The electrohydraulic servo includes pedal position linear variable differential transducer (LVDT) 16 which provides nose gear position command, a servo loop comprised of an electrohydraulic valve having coils L1 and L2 driven by valve driver amplifier 12 and a linear actuation position feedback transducer 17. Potential for failures exists in this servo loop. A wiring failure between amplifier 12 and the valve will result in a relatively slow drift of nose gear rotation because the current in both L1 and L2 becomes zero, and control of the valve is lost. Certain failures in amplifier 12 such as a shorted or open transistor will result in a rapid nose gear rotation due to errant current in the valve coils. An open wire in the excitation wiring of position feedback transducer 17 will cause the nose gear to be difficult to control, since pilot inputs would control nose gear rate and not position. An open wire in the feedback transistor output will also cause a system failure and input transducer 16 will have no control. Failures occurring outside the servo loop are typically less hazardous.

A monitoring system is provided in accordance with an embodiment of the present invention to detect failures and automatically disengage the nose gear steering system.

The circuit of FIG. 3 monitors the integrity of the wiring and servo valve driver amplifier 12 including the wiring to the valve itself. This is accomplished by monitoring valve driver amplifier 12 including the valve wiring by utilizing monitor amplifier 13, both amplifiers being preferably comprised of the demodulator circuit described above. The output of monitor amplifier 13 is applied to dummy load R25 and the current through R25 is compared with actual valve current through L1 and L2 (nominal 1K). An opto isolator or opto coupler Q7 is used to detect when the actual valve coil current differs from the output current of monitor amplifier 13 through dummy load resistor R25 by more than a certain amount. When this "trip value" of current difference is reached (e.g., 4 milliamps or half of full valve current), Q7 is turned on, turning on transistor Q5 of relay circuit 18, turning off transistor Q6, causing relay K1 to cut off the NGS selector valve and turn on warning light 15. If the wire from amplifier 12 to valve coils L1 and L2 breaks open, the valve current will go to 0. With 0 current, some slight oil flow will result which will cause the nose gear to slowly drift in one direction or the other. But when it moves 2.56° from the followed up or balanced position (assuming the input pedal command is not changed at all), feedback LVDT 17 will output 2 volts, which, assuming a gain of 2 MA/volt, will produce 4 milliamps out of monitor amplifier 13. This will trigger Q7 and cut off NGS via relay circuit 18. Most likely, however, when the pilot senses the resulting nose gear motion, he will move the pedals to correct the motion, causing the output of monitor amplifier 13 to reach the 4 milliamp trip level before the nose gear moves 2.56°. If the output wiring of input LVDT 16 or feedback LVDT 17 opens or shorts to ground, transistor Q1 of LVDT output integrity monitor circuit 19 automatically senses this condition and deenergizes relay K1 via diode D7, cutting off the NGS system and turning on warning light 15. If excitation current to feedback LVDT 17 is lost, transistor Q2 of feedback LVDT excitation monitor circuit 20 automatically senses the condition and deenergizes K1 via diode D2; without position feedback, pedal position commands nose gear rate making control very difficult if not hazardous. It is not necessary to monitor excitation of input LVDT 16 because the nose gear will center if excitation is lost. The system of FIG. 3 therefore prevents virtually all NGS failures which might result in a hazardous situation, including airplane wiring failures, as well as electronic failures.

Resistors R7–R11 and R28 of valve driver 12 and resistors R18–R22 and R17 of monitor amplifier 13 correspond to resistors R2, R4, R3, R5, R6 and R1, respectively, of the demodulator circuit of FIG. 1. Voltage divider resistors R12, R13 and R23, R24 provide desired voltage levels to the current comparator circuit comprised of opto coupler Q7, resistor R16, diodes D5, D6 and capacitor C4. Voltage divider resistors R14, R15 provide the desired above ground reference voltage to valve driver amplifier 12 and monitor amplifier 13. It is a feature of the present invention that the reference signal be maintained through the output windings of LVDT transducers 16 and 17. This permits detection of a failure on the transducers as henceforth will be described. Resistors R26 and R27 bias transistors Q5 and Q6, resistor R30 is utilized to bias transistor Q1 and resistor R29 is utilized to apply switching current from feedback LVDT 17 to the base of transistor Q1. Resistors R31 and R32 are utilized to bias transistor Q2. Capacitors C1–C4 are filter capacitors.

In the illustrated embodiment, the signal controlling the servo action is 400 Hz, variable amplitude, in-phase or opposite-phase, compared to the 400 Hz excitation of the two LVDT transducers 16 and 17. The input LVDT 16 is moved by the pilot's pedals. If the input LVDT 16 is moved to command say left-hand nose gear movement, the input LVDT 16 puts out for example an in-phase 400 Hz signal, with its amplitude proportional to the amount of nose-gear movement commanded. This 400 Hz signal voltage appears at the inputs to both demodulators 12 and 13, resulting in unidirectional current in servo valve coils L1 and L2, causing hydraulic oil flow to move the nose gear. An equal unidirectional current is produced in dummy load R25, such that Q7 does not get triggered, and so the nose gear system continues to operate. When the nose gear moves far enough to cause the feedback LVDT 17 to produce voltage equal to but opposite in phase to the command voltage from input LVDT 16, the valve coils current and the dummy load R25 current go to nominal zero, and the nose gear stops moving.

The 400 Hz signal circuit consisting of the output coils of input LVDT 16 and feedback LVDT 17 and interconnecting wiring is floated at nominal +14 volts DC, by being connected to the voltage divider R14–R15. If this 400 Hz signal circuit is opened by a broken wire or coil, or if it gets shorted to ground, the DC base drive to transistor Q1 disappears, cutting off transistor Q1, turning on transistor Q5 through diode D7, cutting off transistor Q6, deenergizing relay K1 and deactivating the hydraulic pressure to the nose gear, allowing the nose gear to then caster or trail. By the means described above, the presence or loss of DC voltage superimposed on the AC 400 Hz circuit is used to tell whether the transducer circuit is proper or failed. Opto coupler Q7 is used as a comparator to detect failures in electronic demodulators 12 and 13, and transistor Q2 of monitor circuit 20 detects loss of excitation of feedback LVDT 17, as described previously.

Various embodiments of the invention have now been described in detail. The foregoing description is illustrative and explanatory of the invention, and it is anticipated that various modifications may be made to the disclosed embodiment, including particular components and component values, without departing from the nature and spirit of the invention. Accordingly, it should be understood that, within the scope of the appended claims, the invention may be practiced otherwise than as specifically illustrated and described.

What is claimed is:

1. A system monitoring circuit comprising:
   (a) first and second phase-sensitive full-wave demodulator circuits of essentially identical construction having input and output terminal means;
   (b) means, coupled to the input terminal means of said first and second demodulator circuits, for applying an AC input signal indicative of a sensed condition to both said demodulator circuits, said first and second demodulator circuits comprising means generating output signals proportional in magnitude to said input signal and of a polarity dependent upon the phase of said input signal;
   (c) an actual load coupled to and driven by the output terminal means of said first demodulator circuit;
   (d) a dummy load having essentially the same resistivity as said actual load coupled to the output terminal means of said second demodulator circuit;
   (e) current comparator means coupled to said actual load and to said dummy load for generating a control signal when the difference between the currents flowing through the loads reaches a predetermined threshold value.

2. The circuit according to claim 1, the means coupled to the input terminal means of said first and second demodulator circuits comprising sensor means coupled to the input terminal means of said first and second demodulator circuits for applying an AC input signal having phase and amplitude indicative of said sensed condition to both said demodulator circuits.

3. The circuit according to claim 2 wherein said sensor means includes a pair of series connected variable differential transformer devices coupled through their output windings in series to the input terminal means of both said demodulator circuits and to a predetermined voltage level.

4. The circuit according to claim 3 wherein said circuit is coupled to control and monitor an aircraft steering system.

5. The circuit according to claim 3, including means for maintaining the predetermined voltage level above ground and means for detecting zero voltage conditions in the transformer windings to detect failures.

6. The circuit according to claim 1 including a controlled device coupled to said current comparator means and controlled by said control signal.

7. The circuit according to claim 6, including a sensor means coupled to the input terminal means of said first and second demodulator circuits for applying an AC input signal indicative of a sensed condition to said demodulator circuits, wherein said controlled device is also coupled to said sensor means and is controlled by said sensor means.

8. The circuit according to claim 6 wherein said controlled device includes an operator indicator means for informing the operator of a system failure.

9. The circuit according to claim 1 wherein said current comparator means is an opto coupler device.

10. A monitor circuit comprising:
   (a) first and second phase-sensitive full-wave demodulator circuits, each circuit including:
      (i) an operational amplifier means having a positive input terminal, a negative input terminal and an output terminal;

(ii) first and second series connected resistive means coupling said output terminal to said negative input terminal;

(iii) third resistive means coupling the node between said first and second resistive means to a predetermined voltage level;

(iv) fourth and fifth resistive means respectively coupling an AC input signal to the positive and negative terminals of said operational amplifier means;

(v) a field effect transistor having source, drain and gate terminals, said drain terminal being coupled to the positive terminal of said operational amplifier means, said source terminal being coupled to said predetermined voltage level; and (vi) sixth resistive means for coupling an AC reference voltage to the gate terminal of said field effect transistor, the reference voltage being of the same frequency as the AC input signal, the input signal being in phase with the reference voltage for error signals in a first direction and in opposite phase with the reference voltage for error signals in a second direction, wherein a demodulated output signal of amplitude proportional to the amplitude of said AC input signal is generated at said output terminal, the amplitude of said output signal being negative for an input signal which is of the same phase as said reference voltage and positive for an input signal which is of the opposite phase as said reference voltage;

(b) an actual load coupled to and driven by the output of said first demodulator circuit;

(c) a dummy load having essentially the same resistivity as said actual load coupled to the output of said second demodulator circuit;

(d) current comparator means coupled to said actual load and to said dummy load for generating a control signal when the difference between the currents flowing through the loads reaches a predetermined threshold value.

11. The circuit according to claim 10 including sensor means coupled to the fourth and fifth resistive means of both said first and second demodulator circuits for applying an AC input signal having an amplitude indicative of a sensed condition to both said demodulator circuits.

12. The circuit according to claim 11 wherein said sensor means includes a pair of series connected variable differential transformer devices coupled through their output windings in series to the fourth and fifth resistive means of both said demodulator circuits and to a predetermined voltage level.

13. The circuit according to claim 12 wherein said circuit is coupled to control and monitor an aircraft steering system.

14. The circuit according to claim 11, including means for maintaining the predetermined voltage level above ground and means for detecting zero voltage conditions in the transformer output windings to detect failures.

15. The circuit according to claim 10 including a controlled device coupled to said current comparator means and controlled by said control signal.

16. The circuit according to claim 15, including a sensor means coupled to the input terminal means of said first and second demodulator circuits for applying an AC input signal, indicative of a sensed condition, to said demodulator circuits, wherein said controlled device is also coupled to said sensor means and is controlled by said sensor means.

17. The circuit according to claim 15 wherein said controlled device includes an operator indicator means for informing the operator of a system failure.

18. The circuit according to claim 10 wherein said current comparator means is an opto coupler device.

* * * * *